(12) United States Patent
Arendt et al.

(10) Patent No.: US 12,354,905 B2
(45) Date of Patent: Jul. 8, 2025

(54) GATE AND LOCOS DIELECTRICS GROWN USING LOCOS PROCESSING

(71) Applicant: TEXAS INSTRUMENTS INCORPORATED, Dallas, TX (US)

(72) Inventors: Mark Francis Arendt, Richardson, TX (US); Damien Thomas Gilmore, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 560 days.

(21) Appl. No.: 17/588,091

(22) Filed: Jan. 28, 2022

(65) Prior Publication Data

US 2023/0245919 A1    Aug. 3, 2023

(51) Int. Cl.
*H01L 21/762* (2006.01)
*H01L 21/02* (2006.01)
*H01L 21/28* (2006.01)

(52) U.S. Cl.
CPC .... *H01L 21/76221* (2013.01); *H01L 21/0217* (2013.01); *H01L 21/02271* (2013.01); *H01L 21/28211* (2013.01)

(58) Field of Classification Search
None
See application file for complete search history.

(56) References Cited

U.S. PATENT DOCUMENTS

| | | | | | |
|---|---|---|---|---|---|
| 4,239,990 | A | * | 12/1980 | Hong | G11C 11/409 257/E27.084 |
| 4,401,691 | A | * | 8/1983 | Young | H01L 21/31662 257/E21.258 |
| 5,580,815 | A | * | 12/1996 | Hsu | H01L 21/32 257/E21.258 |
| 2006/0289947 | A1 | * | 12/2006 | Yamanaka | H01L 21/823857 257/E21.639 |

OTHER PUBLICATIONS

Kuiper, et al., "Thermal oxidation of silicon nitride and silicon oxynitride films," Journal of Vacuum Science & Technology B: Microelectronics Processing and Phenomena 7, 455 (1989) AIP Publishing, 1305 Walt Whitman Road, Suite 300, Melville, NY 11747 doi: 10.1116/1.584769.

* cited by examiner

*Primary Examiner* — Feifei Yeung Lopez
(74) *Attorney, Agent, or Firm* — Yudong Kim; Frank D. Cimino

(57) ABSTRACT

Described examples include a method having steps of forming an isolation pad oxide layer on a substrate and forming and patterning a silicon nitride layer on the isolation pad oxide layer. The method also has steps of oxidizing portions of the substrate not covered by the silicon nitride layer to form a LOCOS layer and oxidizing the silicon nitride layer in an oxidizing ambient containing a chlorine source to form a silicon dioxide layer.

20 Claims, 12 Drawing Sheets

US 12,354,905 B2

GATE AND LOCOS DIELECTRICS GROWN USING LOCOS PROCESSING

TECHNICAL FIELD

This relates generally to semiconductor manufacturing and more particularly to the fabrication of silicon dioxide gate and isolation structures in semiconductors.

BACKGROUND

Local oxidation of silicon (LOCOS) is a technique for fabricating isolation structures in silicon semiconductor devices. Generally, a layer of silicon nitride is deposited on a sacrificial isolation pad oxide on the semiconductor silicon wafer. The silicon nitride layer is patterned to expose where LOCOS isolation structures are to be grown. The semiconductor silicon wafer is then exposed to an oxidizing atmosphere at temperatures from 800° C. to 1200° C. to grow silicon dioxide isolation structures that are not covered by the silicon nitride layer. The silicon nitride is removed, and further processing grows devices in the areas between the LOCOS isolation structures.

The critical device silicon underlying the isolation pad oxide is subject to contamination and damage from the isolation pad oxide processing and must be removed from the active device area, i.e., moat silicon. Once the isolation pad oxide is removed, another sacrificial silicon dioxide layer is grown to protect the moat areas. The sacrificial oxide is removed, and the critical metal-oxide semiconductor (MOS) device gate oxide layer is grown. Each of these oxidations requires a separate pre-furnace clean and a separate furnace process. Every additional furnace process adds contamination and complexity to the manufacturing process flow.

SUMMARY

In accordance with an example, a method includes forming an isolation pad oxide layer on a substrate and forming and patterning a silicon nitride layer on the isolation pad oxide layer. The method also includes oxidizing portions of the substrate not covered by the silicon nitride layer to form a LOCOS layer and oxidizing the silicon nitride layer in an oxidizing ambient containing a chlorine source to form a silicon dioxide layer.

DETAILED DESCRIPTION

Figure 1:
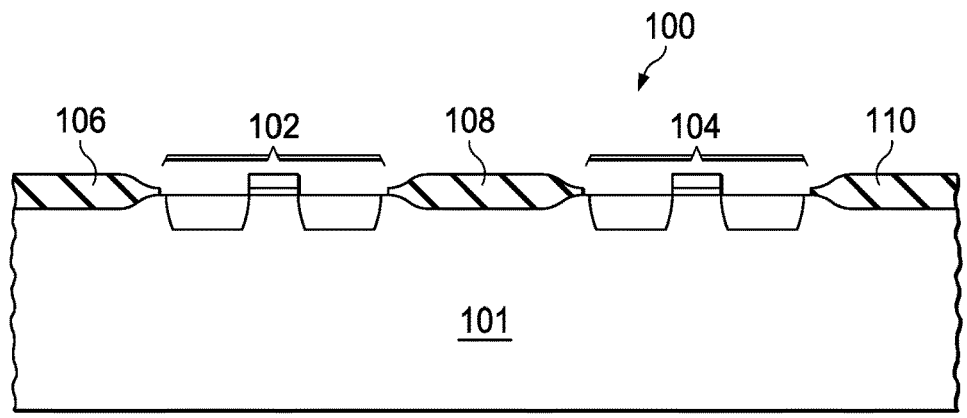
FIG. 1 is a cross-section of an example integrated circuit.

In the drawings, corresponding numerals and symbols generally refer to corresponding parts unless otherwise indicated. The drawings are not necessarily drawn to scale.

In this description, the terms "on" and "over" may include layers or other elements where intervening or additional elements are between an element and the element that it is "on" or "over." Also as used in this description, the term "formed," "form," or "forming" includes depositing, implanting, growing, or any other process for creating the object that is "formed."

In example arrangements, the problem of efficient fabrication of silicon dioxide layers with different thicknesses is solved using an oxidation step including a chlorine bearing agent that converts silicon nitride to silicon oxide. An example method includes growing an isolation pad oxide layer on a substrate and depositing and patterning a silicon nitride layer on the isolation pad oxide layer. The method also includes oxidizing portions of the substrate not covered by the silicon nitride layer to grow a LOCOS layer and oxidizing the silicon nitride layer in an oxidizing ambient containing a chlorine source to grow a silicon dioxide layer.

FIG. 1 is a cross-section of an example integrated circuit 100. Moat area 102 contains one active device. In this example, the one active device is a transistor. Moat area 104 contains another active device. Silicon dioxide layer 108 separates moat area 102 from moat area 104. Silicon dioxide layer 106 separates moat area 102 from other devices in substrate 101. Silicon dioxide layer 110 separates moat area 104 from other devices in substrate 101. Silicon dioxide layer 106, silicon dioxide layer 108, and silicon dioxide layer 110 are grown using local oxidation of silicon (LOCOS). The LOCOS process is more fully explained with regard to FIGS. 2 and 3 hereinbelow. Silicon dioxide layer 106, silicon dioxide layer 108, and silicon dioxide layer 110 provide lateral electrical isolation between active components.

Figure 2:
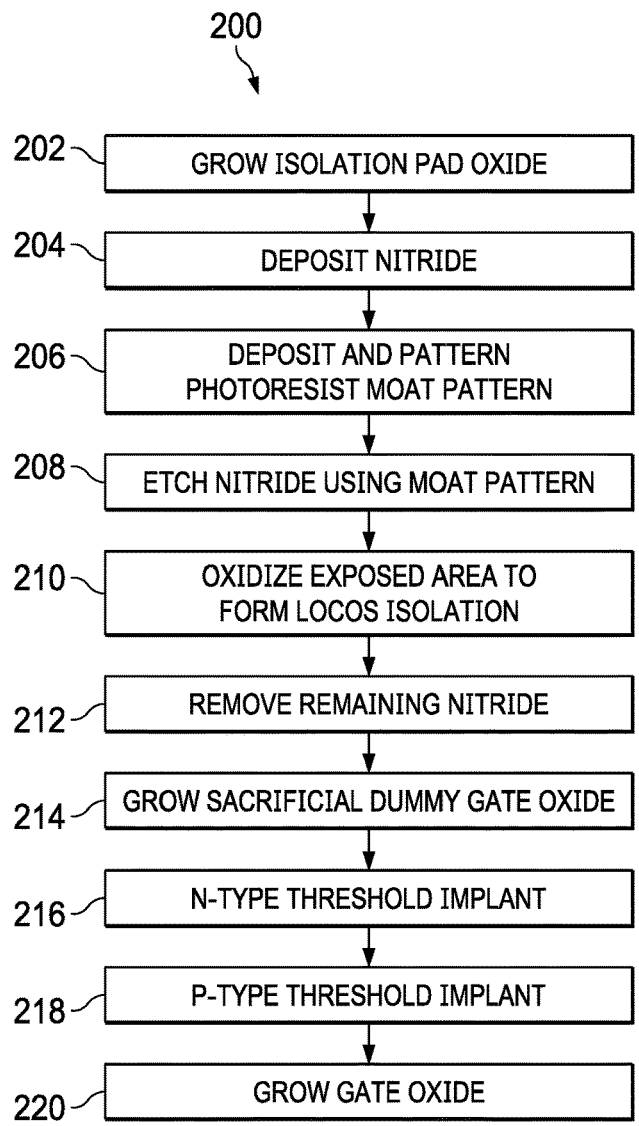
FIG. 2 is a flow diagram of an example process.
Figure 3A:
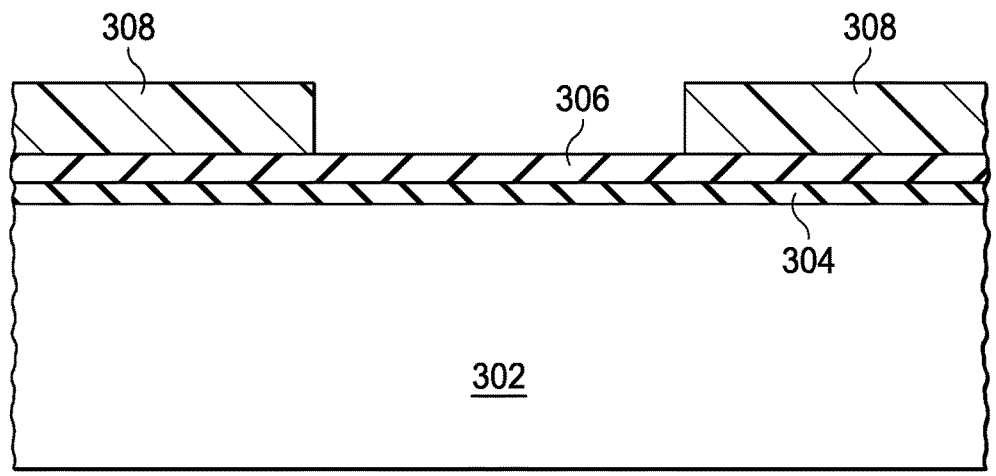
FIGS. 3A through 3G (collectively "FIG. 3") are cross section diagrams that illustrate the steps of the process of FIG. 2.

FIG. 2 is a flow diagram of an example process 200 for growing LOCOS isolation and gate oxide layers. FIGS. 3A through 3G (collectively "FIG. 3") are cross section diagrams that illustrate the steps of process 200 of FIG. 2. Step 202 is growing an isolation pad oxide layer. As shown in FIG. 3A, thermal oxidation grows isolation pad oxide layer 304 on substrate 302 to a thickness of about 100 Å, in this example. Step 204 is depositing a silicon nitride layer on the silicon dioxide layer. As shown in FIG. 3A. Silicon nitride layer 306 is deposited on isolation pad oxide layer 304. Chemical vapor deposition (CVD) deposits silicon nitride layer 306 to a thickness of about 2,000 Å, in this example. The purpose of isolation pad oxide layer 304 is to protect the underlying substrate 302 from wet etch or dry etch induced damage.

Figure 3B:
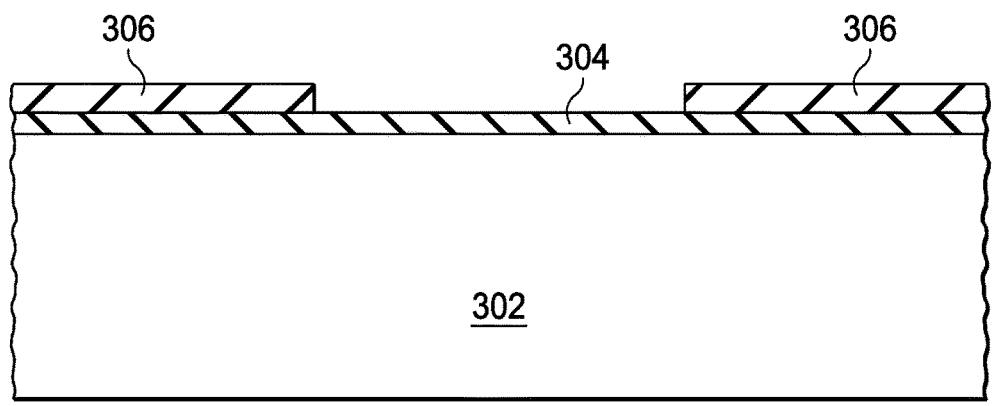
Figure 3C:
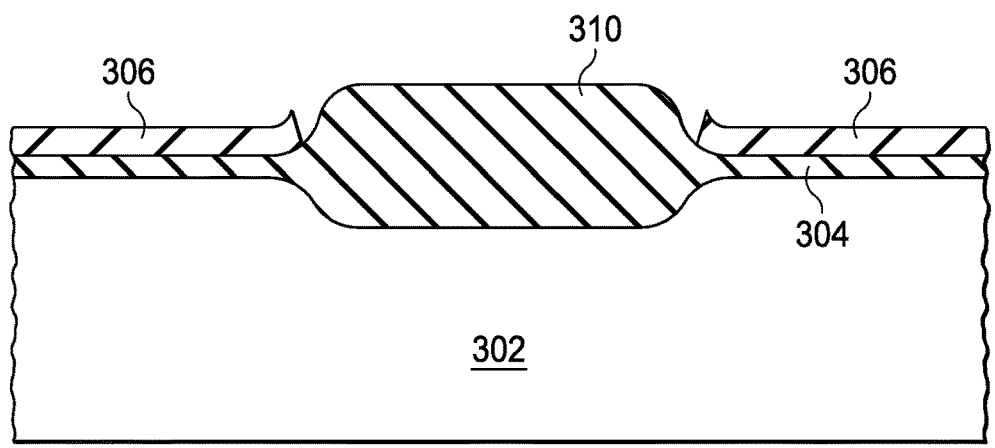
Figure 3D:
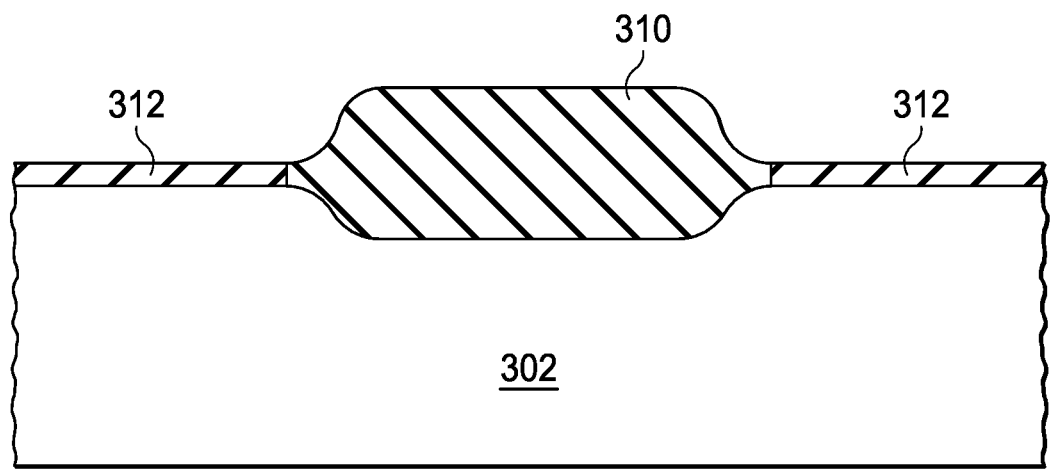

Step 206 is depositing and patterning a layer of photoresist on the silicon nitride layer. As shown in FIG. 3A, first photoresist layer 308 is deposited on silicon nitride layer 306 and patterned using photolithography. Step 208 is etching the silicon nitride layer using the moat pattern of the photoresist layer. As shown in FIG. 3B, plasma etching using a plasma selective to silicon nitride removes the portions of silicon nitride layer 306 not covered by first photoresist layer 308 and then first photoresist layer 308 is removed. Step 210 is oxidizing the exposed areas to form LOCOS isolation structures. As shown in FIG. 3C, oxidation in a steam ambient at about 950° C. for about two hours grows LOCOS layer 310 to a thickness of about 5,000 Å, in this example. Silicon nitride layer 306 serves as an oxidation barrier in this process, so the LOCOS regions are only grown in the areas exposed by silicon nitride layer 306. Step 212 removes the remaining portions of silicon nitride layer 306. As shown in FIG. 3D, an isotropic etch selective to silicon nitride, which may be a wet etch or a dry etch, removes the remaining portions of silicon nitride layer 306. The portions of isolation pad oxide layer 304 are usually damaged by the removal of silicon nitride layer 306. Therefore, a wet etch or dry etch removes the remaining portions of isolation pad oxide layer 304.

Figure 3E:
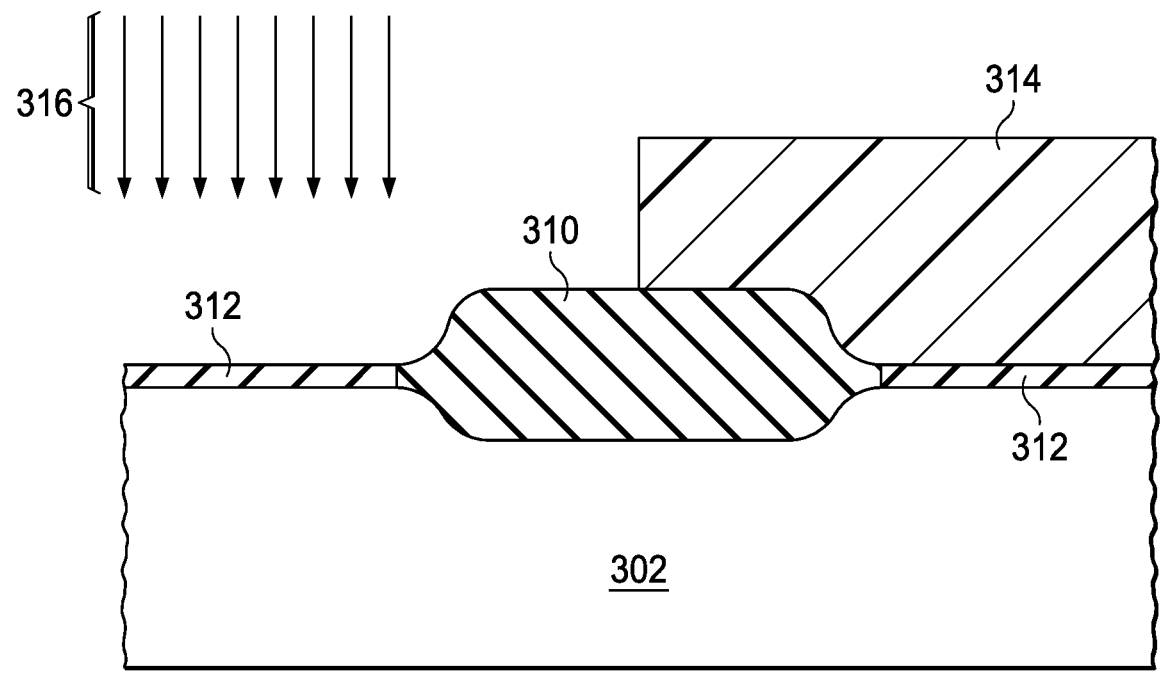

Step 214 is growing a dummy gate oxide. As shown in FIG. 3D, to protect the surface of substrate 302 and to repair any damage that may have occurred, an oxidation step in steam at a temperature of about 800° C. for about 30 minutes grows dummy gate oxide layer 312 to a thickness of about 300 Å, in this example. Step 216 is implanting a threshold adjustment implant for n-type transistors. As shown in FIG. 3E, a second photoresist layer 314 is formed and patterned to protect the areas where p-type transistors will be formed. An ion implantation 316 adjusts the doping level of substrate 302 beneath dummy gate oxide layer 312. The implantation used depends on the doping level of substrate 302, the surface function, the doping of the gate, and the desired threshold voltage. Also, depending on the doping of the substrate 302, a p-well (not shown) is often formed in the moat area where n-type transistors are formed. Given these caveats, an example p-type threshold adjustment for n-type transistors is an implantation of boron ions at 30 KeV with a concentration of about 1×1013 ions/cm. This implantation is not energetic enough to penetrate LOCOS layer 310, and thus will only penetrate the substrate under dummy gate oxide layer 312.

Figure 3F:
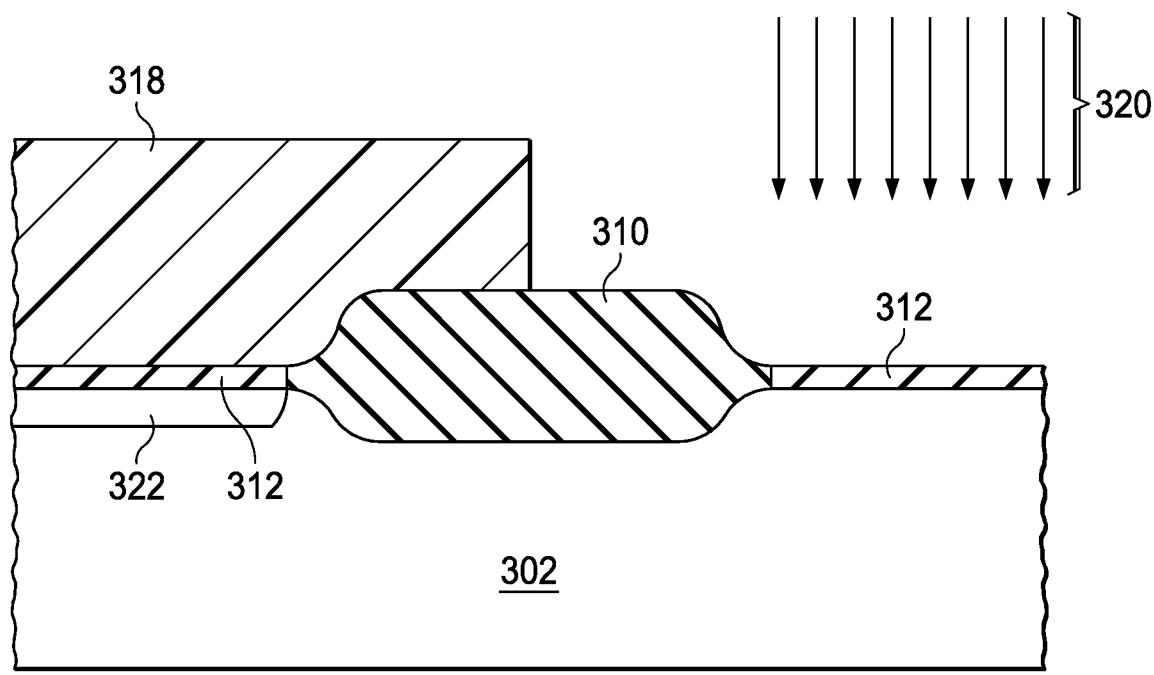

Step 218 is implanting a threshold adjustment implant for p-type transistors. As shown in FIG. 3F, second photoresist layer 314 is removed and a third photoresist layer 318 is formed and patterned to protect the areas where n-type transistors will be formed. An ion implantation 320 adjusts the doping level of substrate 302 beneath dummy gate oxide layer 312. The implantation used depends on the doping level of substrate 302, the surface function, the doping of the gate, and the desired threshold voltage. Also, depending on the doping of the substrate 302, an n-well (not shown) is often formed in the moat area where p-type transistors are formed. Given these caveats, an example n-type threshold adjustment for p-type transistors is an implantation of phosphorus ions at 35 KeV with a concentration of about 1×1013 ions/cm. This implantation is not energetic enough to penetrate LOCOS layer 310, and thus will only penetrate the substrate under dummy gate oxide layer 312.

Figure 3G:
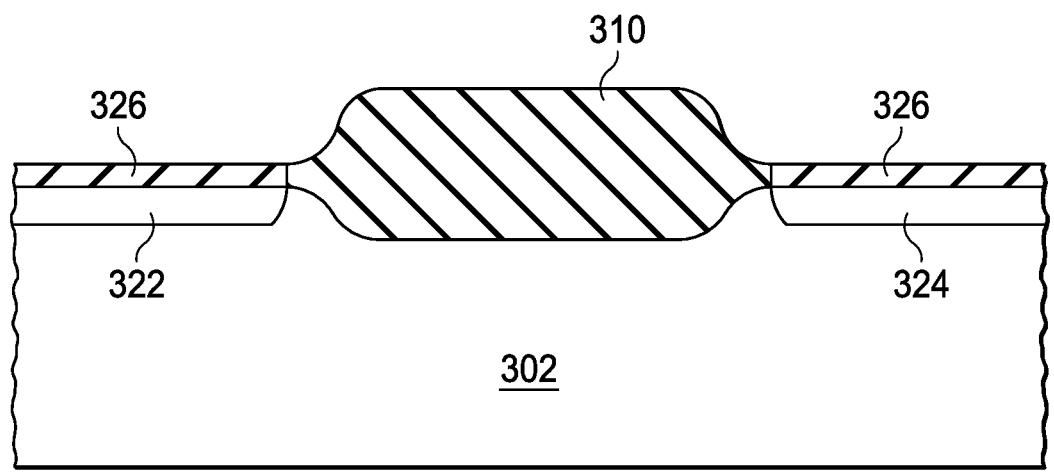

Step 220 is growing the gate oxide layer. As shown in FIG. 3G, anisotropic plasma etching removes dummy gate oxide layer 312. A small portion of LOCOS layer 310 will also be removed, but this thickness is small compared to the overall thickness of LOCOS layer 310. Thermal oxidation in steam at a temperature of about 800° C. for 20 minutes grows gate oxide layer 326 to a thickness of about 200 Å. As shown in FIG. 3G, the implantation of step 216 forms p-type threshold adjustment region 322 for n-type transistors and the implantation of step 218 forms n-type threshold adjustment region 324 for p-type transistors. Of importance, the process of FIGS. 2 and 3 includes three furnace steps: step 210 (form LOCOS), step 214 (form dummy gate), and step 220 (form gate oxide). Every time a lot of wafers is place in or removed from a furnace is an opportunity for contamination. Therefore, it is desirable to minimize the number of furnace steps.

Figure 4:
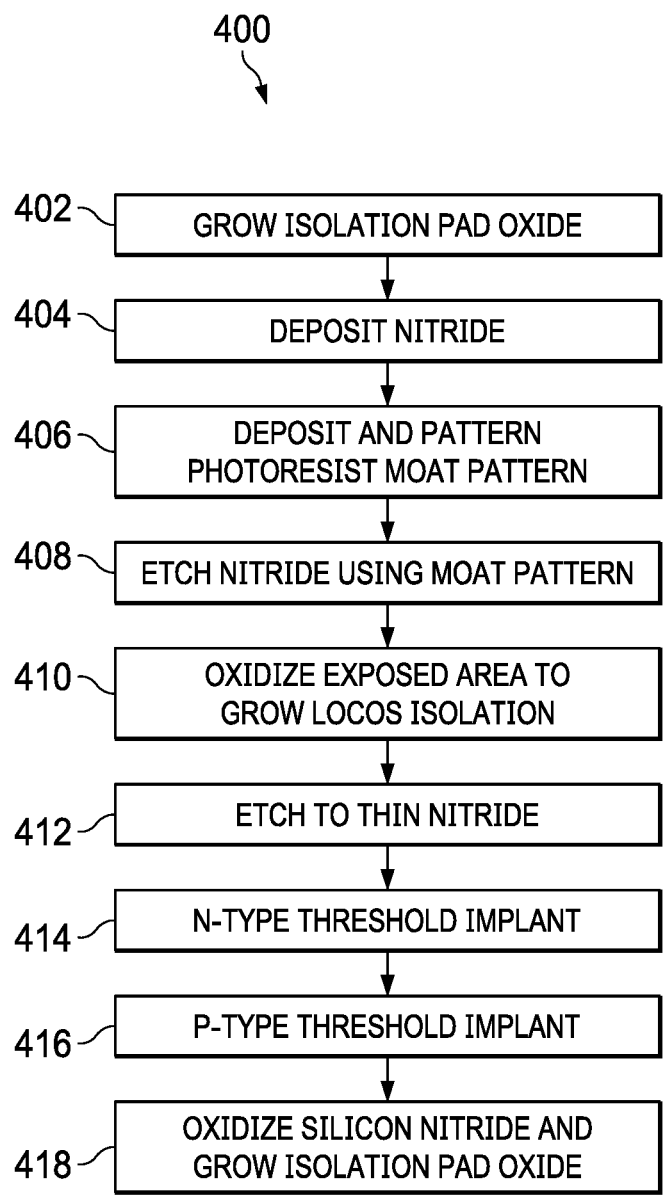
FIG. 4 is a flow diagram of an example process.
Figure 5A:
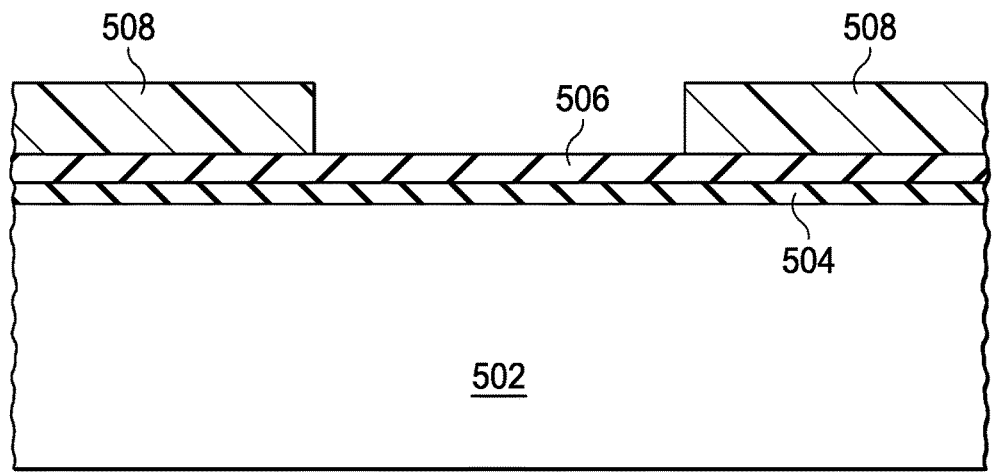
FIGS. 5A through 5G (collectively "FIG. 5") are cross section diagrams that illustrate the steps of the process of FIG. 4.

FIG. 4 is a flow diagram of an example process 400 for forming LOCOS isolation and gate oxide layers. FIGS. 5A through 5G (collectively "FIG. 5") are cross section diagrams that illustrate the steps of process 400 of FIG. 4. Step 402 is growing an isolation pad oxide layer. As shown in FIG. 5A, thermal oxidation grows isolation pad oxide layer 504 on substrate 502 to a thickness of about 100 Å, for example 50 Å to 100 Å. Step 404 is depositing a silicon nitride layer on the silicon dioxide layer. As shown in FIG. 5A, silicon nitride layer 506 is formed by chemical vapor deposition (CVD) on isolation pad oxide layer 504. Silicon nitride layer 506 has a thickness of about 2,000 Å, in this example. As with isolation pad oxide layer 304 (FIG. 3), the purpose of isolation pad oxide layer 504 is to dissipate stresses caused by the CVD process and the different thermal coefficients of silicon nitride (such as silicon nitride layer 506) and crystalline silicon (such as substrate 502) that can cause dislocations in the crystalline structure of substrate 502.

Figure 5B:
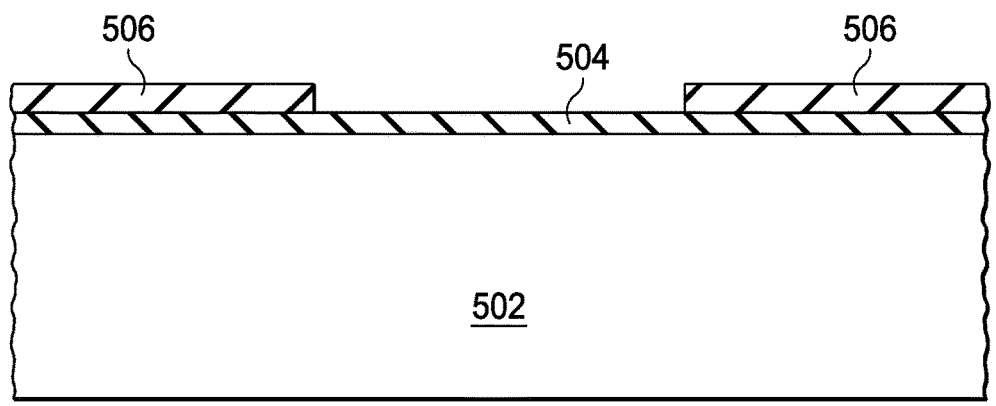
Figure 5C:
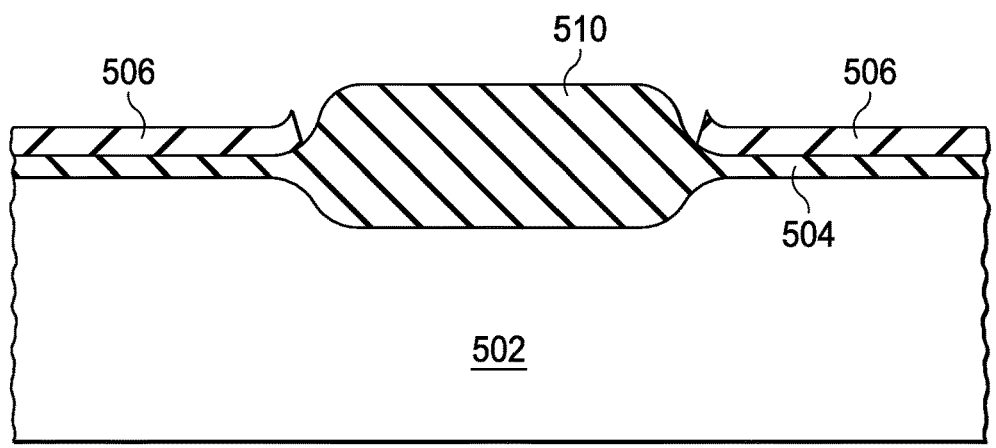

Step 406 is depositing and patterning a layer of photoresist on the silicon nitride layer. As shown in FIG. 5A, first photoresist layer 508 is deposited on silicon nitride layer 506 and patterned using photolithography. Step 408 is etching the silicon nitride layer using the moat pattern of the first photoresist layer. As shown in FIG. 5B, plasma etching using a plasma selective to silicon nitride removes the portions of silicon nitride layer 506 not covered by first photoresist layer 508 and then first photoresist layer 508 is removed. Step 410 is oxidizing the exposed areas to grow LOCOS isolation structures. As shown in FIG. 5C, oxidation in an oxidizing ambient such as steam at about 950° C. for about 1.75 hours forms LOCOS layer 510 to a thickness of about 1,600 Å, in this example. Silicon nitride layer 506 serves as an oxidation barrier in this process, so the LOCOS regions are only formed in the areas exposed by silicon nitride layer 506.

Figure 5D:
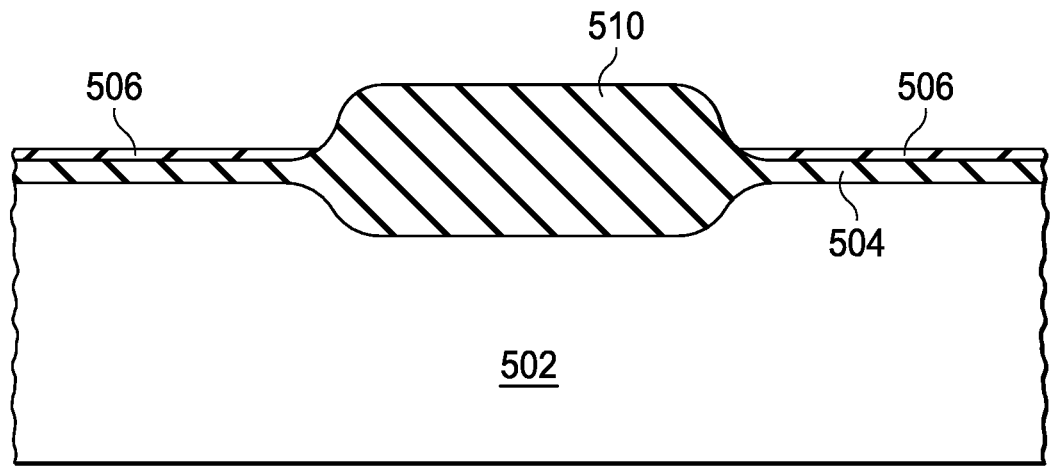
Figure 5E:
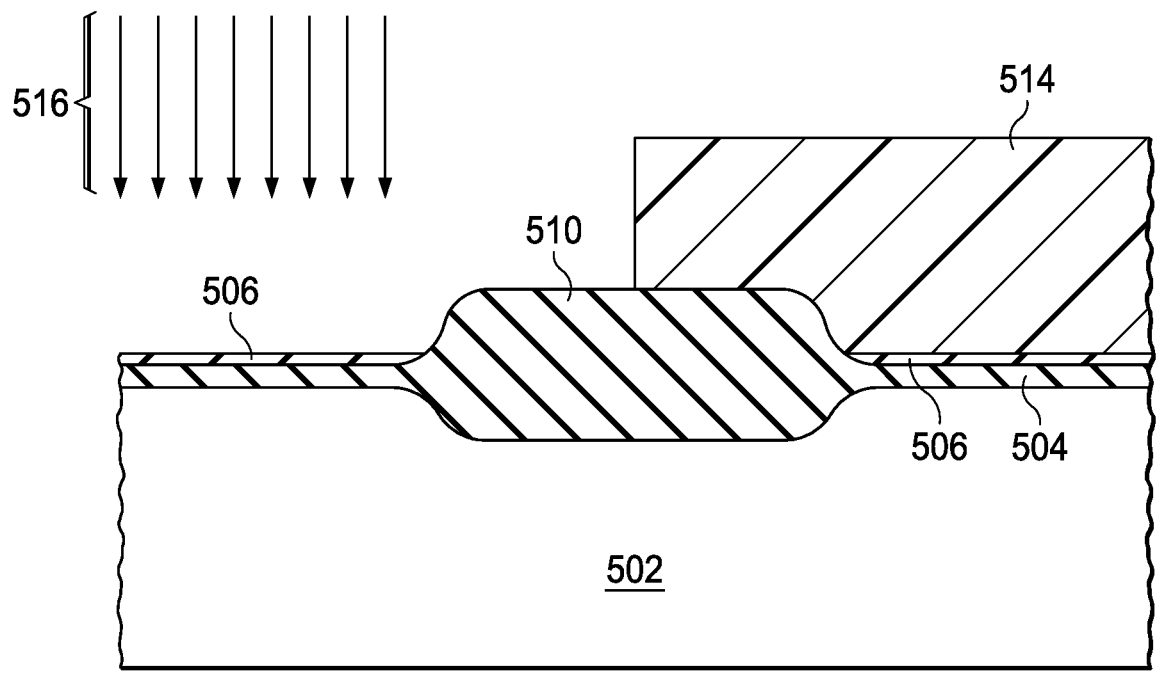

Step 412 thins the silicon nitride layer. As shown in FIG. 5D, the remaining portions of silicon nitride layer 506 above the moat areas are thinned using anisotropic plasma etching selective to silicon nitride. The thickness of the remaining portions of silicon nitride layer 506 are approximately 100 Å, in this example. Step 414 is implanting a threshold adjustment implant for n-type transistors. As shown in FIG. 5E, a second photoresist layer 514 is formed and patterned to protect the areas where p-type transistors will be formed. An ion implantation 516 adjusts the doping level of substrate 502 beneath silicon nitride layer 506 and isolation pad oxide layer 504 on one side of LOCOS layer 510. The implantation used depends on the doping level of substrate 502, the surface function, the doping of the gate, and the desired threshold voltage. Also, depending on the doping of the substrate 502, a p-well (not shown) is often formed in the moat area where n-type transistors are formed. Given these caveats, an example threshold adjustment for n-type transistors is an implantation of boron ions at 30 KeV with a concentration of about $1 \times 10^{13}$ ions/cm. This implantation is not energetic enough to penetrate LOCOS layer 510, and thus will only penetrate the substrate under isolation pad oxide layer 504.

Figure 5F:
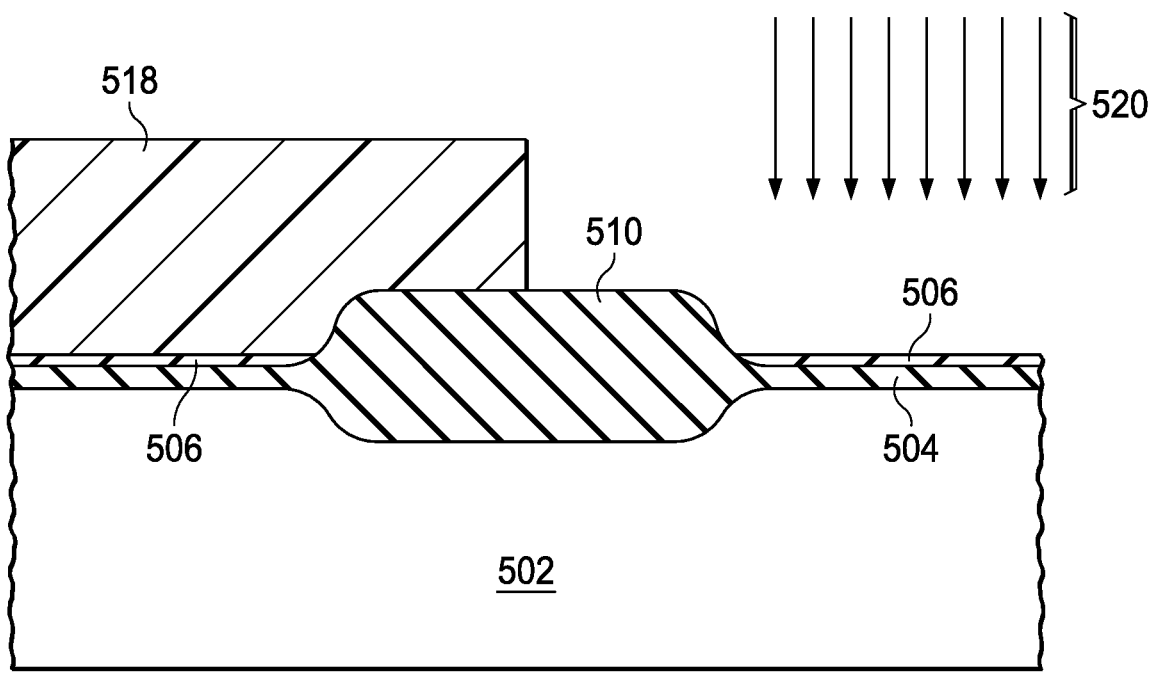

Step 416 is implanting a threshold adjustment implant for p-type transistors. As shown in FIG. 5F, second photoresist layer 514 is removed and a third photoresist layer 518 is formed and patterned to protect the areas where n-type transistors will be formed. An ion implantation 520 adjusts the doping level of substrate 502 beneath silicon nitride layer 506 and isolation pad oxide layer 504 on the right side of LOCOS layer 510. The implantation used depends on the doping level of substrate 502, the surface function, the doping of the gate, and the desired threshold voltage. Also, depending on the doping of the substrate 502, an n-well (not shown) is often formed in the moat area where p-type transistors are formed. Given these caveats, an example threshold adjustment for p-type transistors is an implantation of phosphorus ions at 35 KeV with a concentration of about $1\times10^{13}$ ions/cm. This implantation is not energetic enough to penetrate LOCOS layer 510, and thus will only penetrate the substrate under isolation pad oxide layer 504.

Figure 5G:
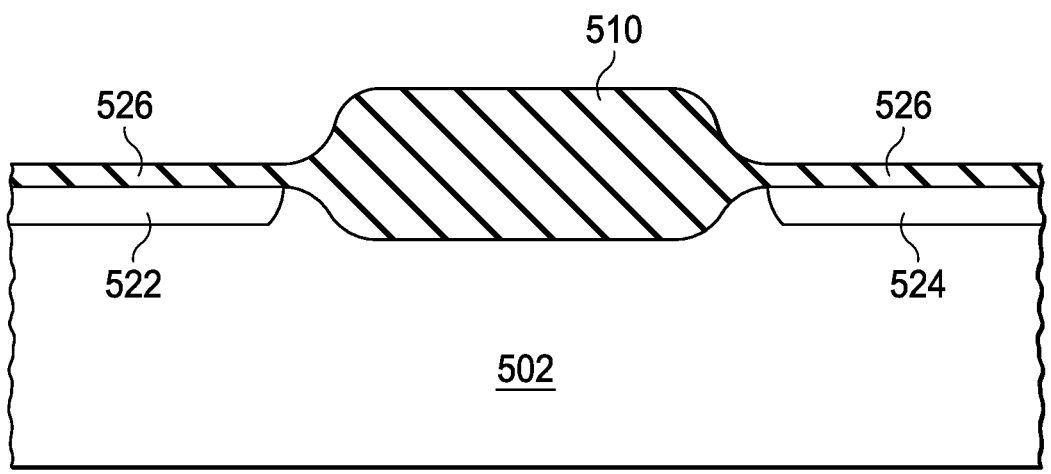

Step 418 is oxidizing the silicon nitride layer and growing the isolation pad oxide. As shown in FIG. 5G, third photoresist layer 518 is removed and the remaining structure is subjected to an oxidation in an oxidizing ambient such as dry oxygen at 950° C. including a chlorine source such as hydrochloric acid with a concentration of 5% (or, in another example, within a range of 3% to 10%) for about three hours, in this example. The exact mechanism by which chlorine facilitates oxidation of is not known, but it is believed that chlorine acts as a catalyst in the process of separating the nitrogen ions in silicon nitride and thus facilitates the formation of silicon dioxide with the separated silicon ions. Examples of chlorine sources include trans dichloroethylene and hydrochloric acid. This oxidizing process grows LOCOS layer 510 to about 5,800 Å, in this example. The oxidizing process also converts silicon nitride layer 506 to silicon dioxide. That is, the remaining 100 Å of silicon nitride layer 506 is converted to 200 Å of silicon dioxide, in this example. The resulting thickness of gate oxide layer 526 (which is a combination of isolation pad oxide layer 504 and the conversion of silicon nitride layer 506 to silicon dioxide) is about 300 Å, in this example. Included in FIG. 5G are threshold adjustment region 522 and threshold adjustment region 524 that are the result of ion implantation 516 and ion implantation 520, respectively. The structure of FIG. 5G is ready for formation of active devices in the moat regions. Example steps for forming active devices are forming gates, removing gate oxide layer 526 not covered by the gates, implanting lightly doped drain regions, forming sidewall layers on the gates and implanting sources and gates.

Of importance, gate oxide layer 526 is grown without removing isolation pad oxide layer 504 and silicon nitride layer 506. Therefore, there is no damage to the surface of substrate 502 that must be repaired by growing subsequent oxide layers. In addition, only two furnace steps are used: step 410 (form LOCOS) and step 418 (oxidize silicon nitride). An additional benefit of the process of FIGS. 4 and 5 is mitigating the Kooi effect. The Kooi effect occurs when nitrogen ions from silicon nitride form ammonia molecules ($NH_3$) while the LOCOS layer is formed in the conventional LOCOS process. Some of these molecules penetrate the isolation pad oxide and the substrate near the "bird's beak" edge of the LOCOS layer. This forms what is called a "white ribbon" layer on the surface of the substrate consisting of silicon nitride and silicon oxynitride. As such, the white ribbon impedes conductive contact to the parts of the substrate where active devices are formed (e.g., sources and drains in field effect transistors). The chlorine used in the oxidation of the silicon nitride layer increases transport of $NH_x$ species away from the substrate and converts some or all of the silicon nitride and silicon oxynitride in the white ribbon area to silicon dioxide, which makes isolation pad oxide layer 504 slightly thicker. Thus, when the gate oxide is removed for contact with the substrate (i.e., sources and drains) there is less silicon nitride and silicon oxynitride in the white ribbon area that impedes clearing the surface of the substrate.

Figure 6:
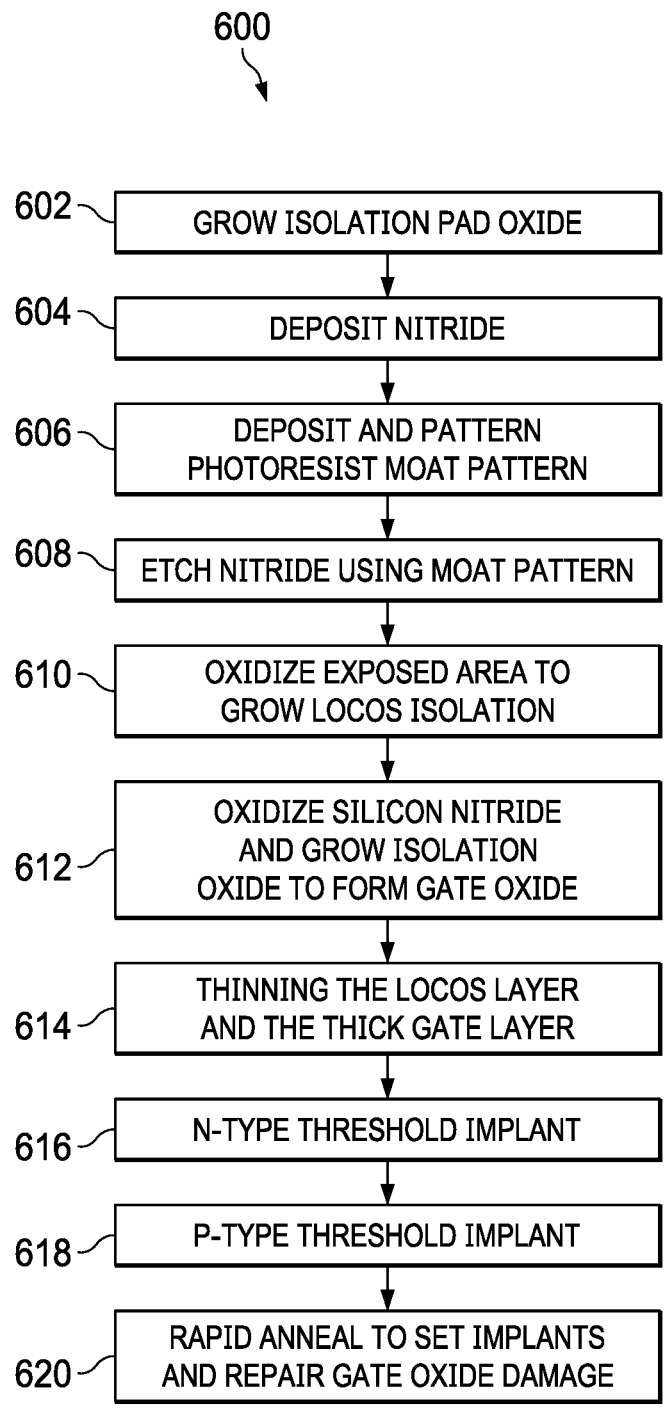
FIG. 6 is a flow diagram of an example process.
Figure 7A:
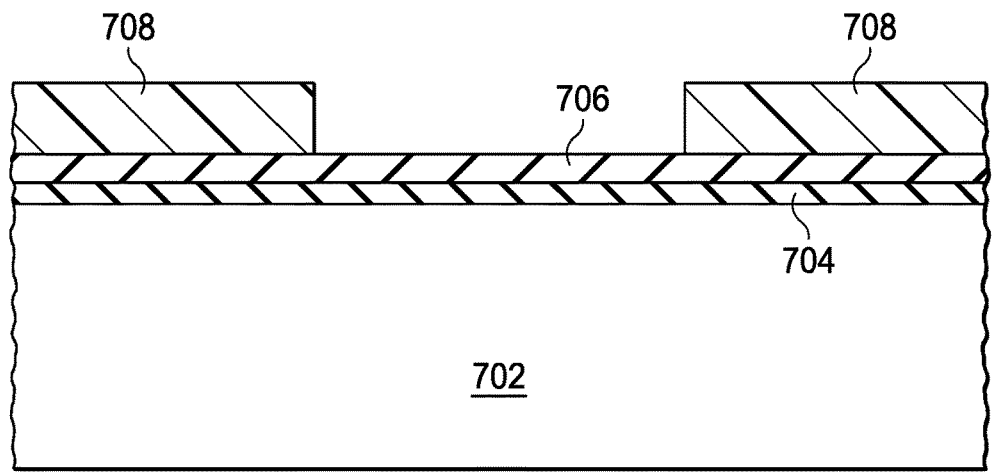
FIGS. 7A through 7H (collectively "FIG. 7") are cross section diagrams that illustrate the steps of the process of FIG. 6.

FIG. 6 is a flow diagram of an example process 600 for growing LOCOS isolation and gate oxide layers. FIGS. 7A through 7H (collectively "FIG. 7") are cross section diagrams that illustrate the steps of process 600 of FIG. 6. Step 602 is forming an isolation pad oxide layer. As shown in FIG. 7A, thermal oxidation grows isolation pad oxide layer 704 on substrate 702 to a thickness of about 100 Å, in this example. Step 604 is depositing a silicon nitride layer on the silicon dioxide layer. As shown in FIG. 7A, silicon nitride layer 706 is deposited by chemical vapor deposition (CVD) on isolation pad oxide layer 704. Silicon nitride layer 706 has a thickness of about 300 Å, in this example. As with isolation pad oxide layer 504 (FIG. 5), the purpose of isolation pad oxide layer 704 is to dissipate stresses caused by the CVD process and the different thermal coefficients of silicon nitride (such as silicon nitride layer 706) and crystalline silicon (such as substrate 702) that can cause dislocations in the crystalline structure of substrate 702.

Figure 7B:
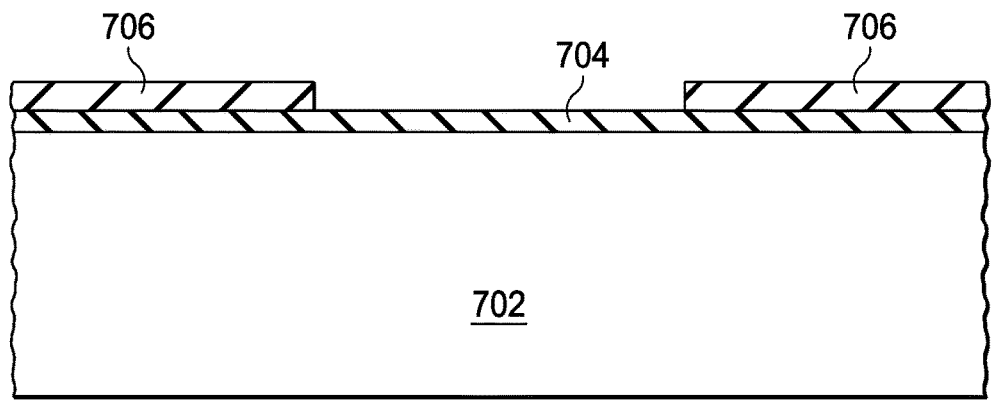
Figure 7C:
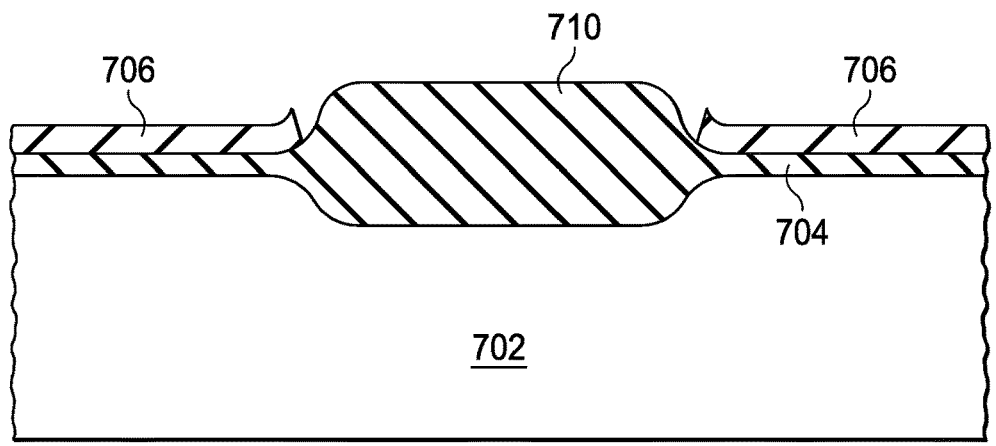

Step 606 is depositing and patterning a layer of photoresist on the silicon nitride layer. As shown in FIG. 7A, first photoresist layer 708 is deposited on silicon nitride layer 706 and patterned using photolithography. Step 608 is etching the silicon nitride layer using the moat pattern of the photoresist layer. As shown in FIG. 7B, plasma etching using a plasma selective to silicon nitride removes the portions of silicon nitride layer 706 not covered by first photoresist layer 708 and then first photoresist layer 708 is removed. Step 610 is oxidizing the exposed areas to form LOCOS isolation structures. As shown in FIG. 7C, oxidation in an oxidizing ambient such as steam at about 950° C. for about 1.75 hours grows LOCOS layer 710 to a thickness of about 4,000 Å, in this example. Silicon nitride layer 706 serves as an oxidation barrier in this process, so the LOCOS regions are only formed in the areas exposed by silicon nitride layer 706.

Figure 7D:
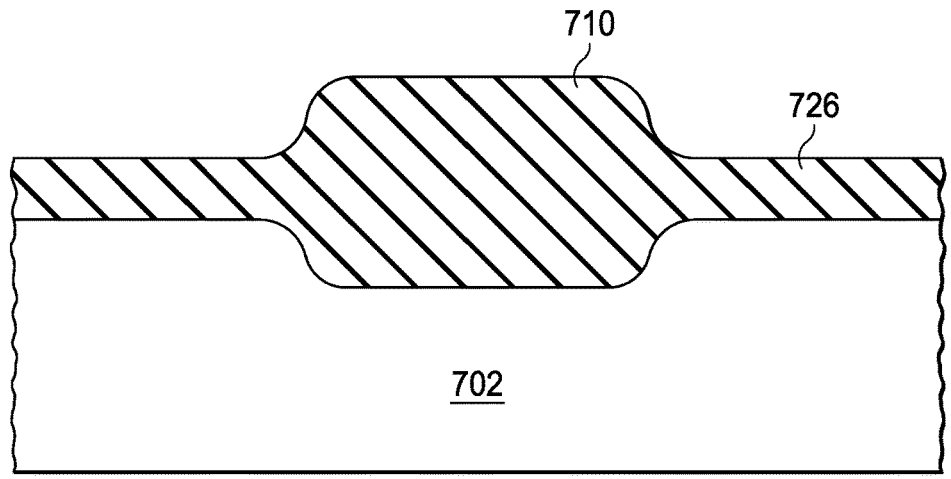
Figure 7E:
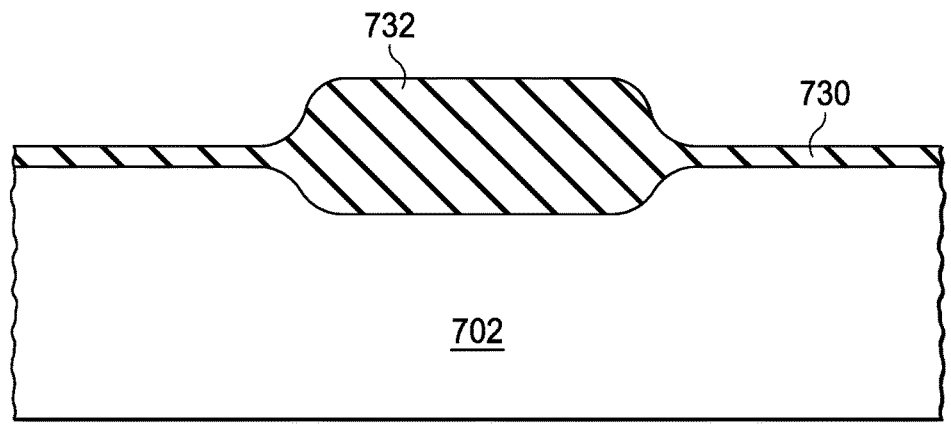

Step 612 is oxidizing the silicon nitride layer and growing the isolation pad oxide. As shown in FIG. 7D, the remaining structure of FIG. 7C is subjected to an oxidation in an oxidizing ambient such as steam including a chlorine source at 950° C. for about three hours. Examples of chlorine sources include trans dichloroethylene and hydrochloric acid. This process expands LOCOS layer 710 to about 6,500 Å, in this example; and converts silicon nitride layer 706 to silicon dioxide; and grows isolation pad oxide layer 704. The resulting thickness of gate oxide layers 726 are about 700 Å, in this example. Step 614 is thinning the LOCOS layer and the thick gate layer. As shown in FIG. 7E, an anisotropic plasma etch is applied to the structure of FIG. 7D. This plasma etch thins both LOCOS layer 710 and thick gate oxide layers 726 by about 400 Å, in this example, resulting in LOCOS layer 732 of approximately 6,100 Å, in this example, and a gate oxide layer 730 having a thickness of about 300 Å, in this example. Step 614 may be optional. In the described example, step 612 increases the thickness of isolation pad oxide layer 704 and converts silicon nitride layer 706 to silicon oxide. The resulting combined thickness provides a gate oxide that is too thick for some applications. Thus, step 614 is used to make thick gate oxide layers 726 thinner.

Figure 7F:
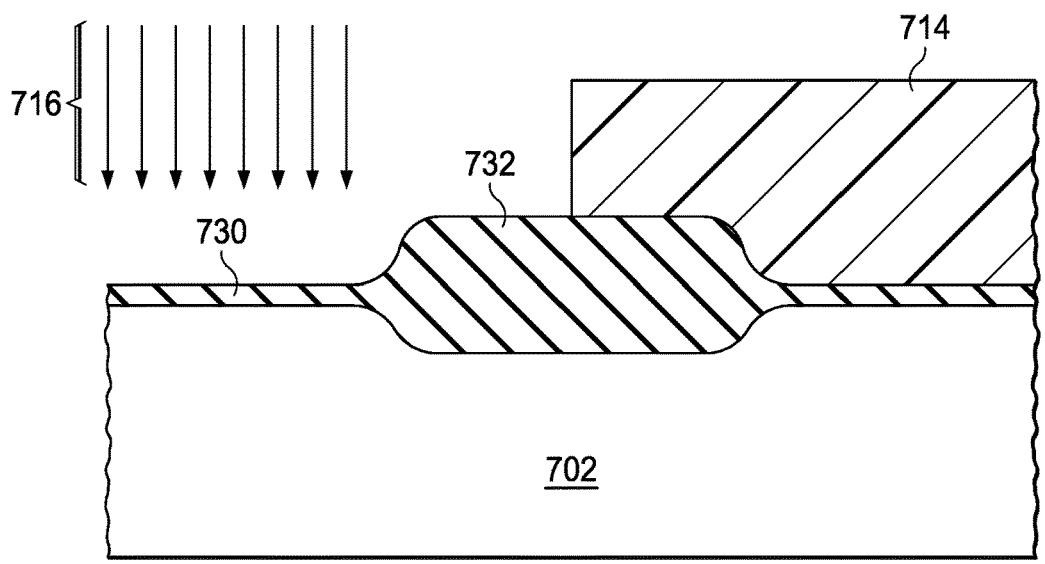

Step 616 is implanting a threshold adjustment implant for n-type transistors. As shown in FIG. 7F, a second photoresist layer 714 is formed and patterned to protect the areas where p-type transistors will be formed. An ion implantation 716 adjusts the doping level of substrate 702 beneath gate oxide layer 730 on one side of LOCOS layer 732. The implantation used depends on the doping level of substrate 702, the surface function, the doping of the gate, and the desired threshold voltage. Also, depending on the doping of the substrate 702, a p-well (not shown) is often formed in the moat area where n-type transistors are formed. Given these caveats, an example threshold adjustment for n-type transistors is an implantation of boron ions at 30 KeV with a concentration of about 1×10¹³ ions/cm. This implantation is not energetic enough to penetrate LOCOS layer 732, and thus will only penetrate the substrate under gate oxide layer 730.

Figure 7G:
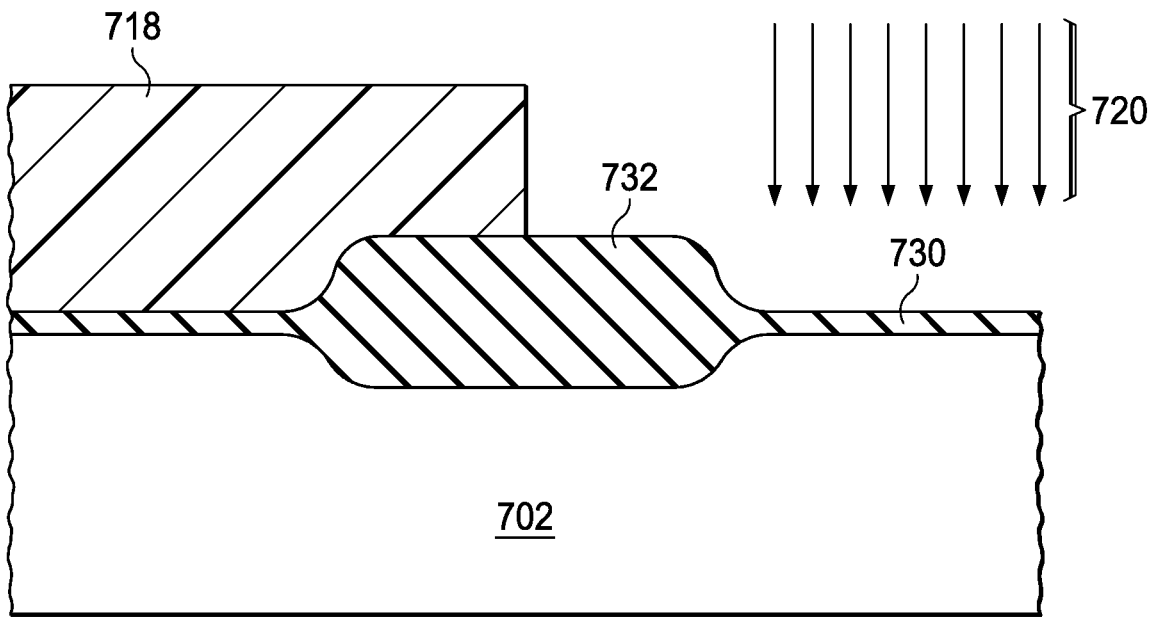

Step 618 is implanting a threshold adjustment implant for p-type transistors. As shown in FIG. 7G, second photoresist layer 714 is removed and a third photoresist layer 718 is formed and patterned to protect the areas where n-type transistors will be formed. An ion implantation 720 adjusts the doping level of substrate 702 beneath gate oxide layer 730 on the right side of LOCOS layer 732. The implantation used depends on the doping level of substrate 702, the surface function, the doping of the gate, and the desired threshold voltage. Also, depending on the doping of the substrate 702, an n-well (not shown) is often formed in the moat area where p-type transistors are formed. Given these caveats, an example threshold adjustment for p-type transistors is an implantation of phosphorus ions at 35 KeV with a concentration of about 1×10¹³ ions/cm. This implantation is not energetic enough to penetrate LOCOS layer 732, and thus will only penetrate the substrate under gate oxide layer 730.

Figure 7H:
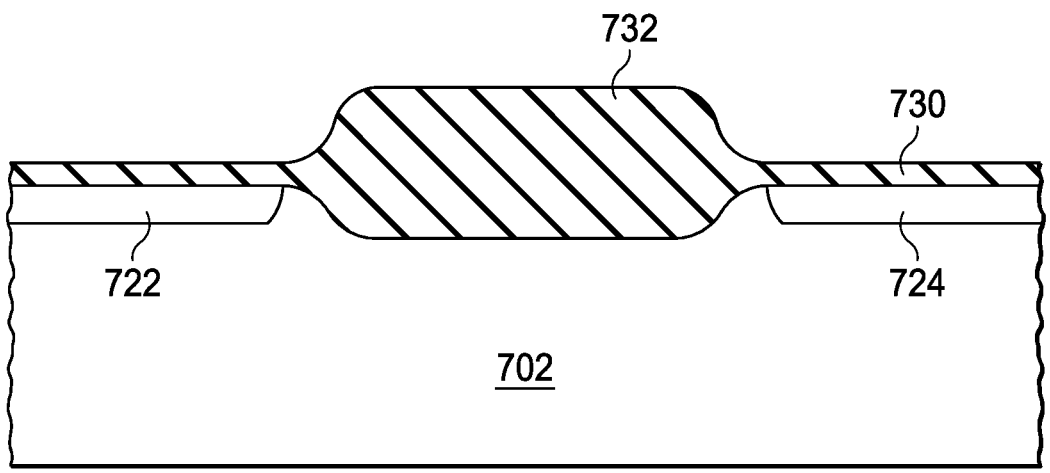

Step 620 is a rapid thermal anneal to drive in the threshold implants and repair any damage to the gate oxide layers. An example of a rapid thermal anneal is subjecting the wafer to 1,000° C. for ten seconds. Included in FIG. 7H are threshold adjustment region 722 and threshold adjustment region 724 that are the result of ion implantation 716 and ion implantation 720, respectively. The structure of FIG. 7H may then be used to form active devices in the moat regions. Example steps are forming gates, removing the gate oxide layer 730 not covered by the gates, implanting lightly doped drain regions, forming sidewall layers on the gates and implanting sources and gates. Of importance, gate oxide layer 730 is grown without removing isolation pad oxide layer 704 and silicon nitride layer 706. Therefore, there is no damage to the surface of substrate 702 that must be repaired by growing subsequent oxide layers. In addition, there are two furnace steps in process 600. However, one directly follows the other. Therefore, step 610 (form LOCOS) and step 612 (oxidize silicon nitride) can be performed without removing the wafer lot from the furnace, and thus are essentially one furnace operation with two parts. In addition, as noted about with regard to the process of FIGS. 4 and 5, the use of chlorine mitigates the Kooi effect.

Modifications are possible in the described examples, and other examples are possible, within the scope of the claims.

What is claimed is:

1. A method comprising:
    forming an isolation pad oxide layer on a substrate;
    forming and patterning a silicon nitride layer on the isolation pad oxide layer;
    oxidizing portions of the substrate not covered by the silicon nitride layer to form a LOCOS layer;
    subsequent to forming the LOCOS layer, oxidizing the silicon nitride layer in an oxidizing ambient containing a chlorine source to form a silicon dioxide layer; and
    thinning the silicon dioxide layer.

2. The method of claim 1, wherein the substrate includes silicon.

3. The method of claim 1, wherein the chlorine source is selected from a group of hydrochloric acid and trans dichloroethylene.

4. The method of claim 1, wherein the thinned silicon dioxide layer and the isolation pad oxide layer form parts of a gate oxide layer.

5. The method of claim 1, further including implanting a threshold adjustment implant into areas of the substrate not covered by the LOCOS layer.

6. The method of claim 1, wherein the oxidizing ambient includes oxygen.

7. The method of claim 1, wherein the silicon nitride layer is formed by chemical vapor deposition.

8. The method of claim 1, further including forming active devices in portions of the substrate not covered by the LOCOS layer after oxidizing the silicon nitride layer.

9. A method comprising:
    forming an isolation pad oxide layer on a substrate;
    forming and patterning a silicon nitride layer on the isolation pad oxide layer;
    oxidizing portions of the substrate not covered by the silicon nitride layer to form a LOCOS layer;
    subsequent to forming the LOCOS layer:
        etching the silicon nitride layer to form a thinned silicon nitride layer; and
        oxidizing the thinned silicon nitride layer in an oxidizing ambient containing a chlorine source to convert the thinned silicon nitride layer into a silicon oxide layer.

10. The method of claim 9, wherein the substrate includes silicon.

11. The method of claim 9, wherein the chlorine source is selected from a group of hydrochloric acid and trans dichloroethylene.

12. The method of claim 9, further including implanting a threshold adjustment implant into areas of the substrate not covered by the LOCOS layer.

13. The method of claim 9, wherein the oxidizing ambient includes oxygen.

14. The method of claim 9, wherein the silicon nitride layer is formed by chemical vapor deposition.

15. The method of claim 9, further including forming active devices in portions of the substrate not covered by the LOCOS layer after oxidizing the thinned silicon nitride layer.

16. A method comprising:
    forming an isolation pad oxide layer on a substrate;
    forming and patterning a silicon nitride layer on the isolation pad oxide layer;
    oxidizing portions of the substrate not covered by the silicon nitride layer to form a LOCOS layer;
    oxidizing the silicon nitride layer in an oxidizing ambient containing a chlorine source to form a silicon dioxide layer; and
    thinning an oxide layer including the combination of the isolation pad oxide layer and the silicon dioxide layer.

17. The method of claim 16, wherein the chlorine source is selected from a group of hydrochloric acid and trans dichloroethylene.

18. The method of claim 16, further including implanting a threshold adjustment implant into areas of the substrate not covered by the LOCOS layer.

19. The method of claim 16, wherein the oxidizing ambient includes oxygen.

20. The method of claim 16, further including forming active devices in portions of the substrate not covered by the LOCOS layer after oxidizing the silicon nitride layer.

* * * * *